United States Patent
Huang et al.

(10) Patent No.: US 7,859,343 B2
(45) Date of Patent: Dec. 28, 2010

(54) HIGH-RESOLUTION VARACTORS, SINGLE-EDGE TRIGGERED DIGITALLY CONTROLLED OSCILLATORS, AND ALL-DIGITAL PHASE-LOCKED LOOPS USING THE SAME

(75) Inventors: Hong-Yi Huang, Taipei (TW); Jen-Chieh Liu, Yilan County (TW); Yuan-Hua Chu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 940 days.

(21) Appl. No.: 11/595,972

(22) Filed: Nov. 13, 2006

(65) Prior Publication Data
US 2008/0111641 A1 May 15, 2008

(51) Int. Cl.
*H03L 7/08* (2006.01)
(52) U.S. Cl. .................................. 331/1 A; 331/177 V
(58) Field of Classification Search .................. 331/1 A, 331/177 V
See application file for complete search history.

(56) References Cited

U.S. PATENT DOCUMENTS

| | | | |
|---|---|---|---|
| 4,272,729 A * | 6/1981 | Riley, Jr. ..................... | 331/1 A |
| 4,447,673 A | 5/1984 | Elliott et al. | |
| 4,531,102 A * | 7/1985 | Whitlock et al. ............ | 331/1 A |
| 4,712,223 A | 12/1987 | Nelson | |
| 4,855,683 A * | 8/1989 | Troudet et al. .............. | 327/159 |
| 5,442,324 A | 8/1995 | Brauns | |
| 5,473,285 A | 12/1995 | Nuckolls et al. | |
| 5,517,155 A | 5/1996 | Yamauchi et al. | |
| 5,974,105 A | 10/1999 | Wang et al. | |
| 6,028,488 A | 2/2000 | Landman et al. | |
| 6,094,081 A | 7/2000 | Yanagiuchi | |
| 6,122,124 A | 9/2000 | Fasen et al. | |

(Continued)

FOREIGN PATENT DOCUMENTS

CN 1212521 3/1999

(Continued)

OTHER PUBLICATIONS

Watanabe et al., "An All-Digital PLL for Frequency Multiplication by 4 to 1022 With Seven-Cycle Lock Time," IEEE Journal of Solid-State Circuits, pp. 198-204, vol. 38, No. 2, Feb. 2003.

(Continued)

*Primary Examiner*—Joseph Chang
(74) *Attorney, Agent, or Firm*—Finnegan, Henderson, Farabow, Garrett & Dunner, LLP

(57) ABSTRACT

A digitally controlled oscillator (DCO) includes a pulse generator for generating a pulse signal upon an edge of a trigger signal, and at least one delay circuit coupled to delay the pulse signal generated by the pulse generator. The pulse generator is coupled to receive one of the delayed pulse signal from the at least one delay circuit and an enable signal as the trigger signal. A digitally controlled varactor (DCV) includes a transistor having a gate, a source, a drain, and a substrate, wherein at least one of the gate, the source, the drain, and the substrate is coupled to receive one of two or more voltages, wherein at least one of the two or more voltages is not a power supply voltage or ground.

14 Claims, 11 Drawing Sheets

U.S. PATENT DOCUMENTS

| | | | |
|---|---|---|---|
| 6,369,738 B1 * | 4/2002 | Swanson | 341/155 |
| 6,414,555 B2 | 7/2002 | Staszewski et al. | |
| 6,577,202 B1 | 6/2003 | Atallah et al. | |
| 6,594,330 B1 | 7/2003 | Wilson | |
| 6,606,004 B2 | 8/2003 | Staszewski et al. | |
| 6,628,739 B1 | 9/2003 | Hayashi | |
| 6,714,084 B2 | 3/2004 | Smith | |
| 6,784,755 B2 | 8/2004 | Lin et al. | |
| 6,791,422 B2 | 9/2004 | Staszewski et al. | |
| 6,798,296 B2 | 9/2004 | Lin et al. | |
| 6,823,133 B1 | 11/2004 | Adkins et al. | |
| 6,970,046 B2 | 11/2005 | Da Dalt et al. | |
| 7,109,815 B1 * | 9/2006 | Groe et al. | 331/179 |

FOREIGN PATENT DOCUMENTS

| | | |
|---|---|---|
| CN | 1233110 | 10/1999 |
| CN | 1731681 | 2/2006 |
| JP | 10-163822 | 6/1998 |

OTHER PUBLICATIONS

Dunning et al., ".An All-Digital Phase-Locked Loop with 50-Cycle Lock Time Suitable for High-Performance Microprocessors," IEEE Journal of Solid-State Circuits, pp. 412-422, vol. 30, No. 4, Apr. 1995.

Chen et al., "A Portable Digitally Controlled Oscillator Using Novel Varactors," IEEE Transactions on Circuits and Systems-II: Express Briefs, pp. 233-237, vol. 52, No. 5, May 2005.

Maymandi-Nejad et al., "A Monotonic Digitally Controlled Delay Element," IEEE Journal of Solid-State Circuits, pp. 2212-2219, vol. 40, No. 11, Nov. 2005.

Vaucher et al., "A Family of Low-Power Truly Modular Programmable Dividers in Standard 0.35-um CMOS Technology," IEEE Journal of Solid-State Circuits, pp. 1039-1045, vol. 35, No. 7, Jul. 2000.

Chang et al., "A Wide-Range and Fast-Locking All-Digital Cycle-Controlled Delay-Locked Loop," IEEE Journal of Solid-State Circuits, pp. 661-670, vol. 40, No. 3, Mar. 2005.

Chung et al., "An All-Digital Phase-Locked Loop for High-Speed Clock Generation," IEEE Journal of Solid-State Circuits, pp. 347-351, vol. 38, No. 2 Feb. 2003.

Olsson et al., "A Digitally Controlled PLL for SoC Applications," IEEE Journal of Solid-State Circuits, pp. 751-760, vol. 39, No. 5, May 2004.

Chen et al., "An All-Digital PLL With Cascaded Dynamic Phase Average Loop for Wide Multiplication Range Applications," pp. 4875-4878, IEEE, 2005.

Cheng et al., "A Novel All Digital Phase Locked Loop (ADPLL) With Ultra Fast Locked Time and High Oscillation Frequency," pp. 139-143, IEEE, 2001.

* cited by examiner

HIGH-RESOLUTION VARACTORS, SINGLE-EDGE TRIGGERED DIGITALLY CONTROLLED OSCILLATORS, AND ALL-DIGITAL PHASE-LOCKED LOOPS USING THE SAME

FIELD OF THE INVENTION

This invention relates in general to high-resolution varactors, single-edge triggered digitally controlled oscillators, and all-digital phase-locked loops using the same.

BACKGROUND

In high-speed integrated circuit (IC) processors or communications systems, phase-locked loops (PLL) are often used to obtain clock signals with accurate frequencies and phases. For example, in a radio frequency (RF) transmitter, a PLL may be used to synthesize a carrier frequency based on a reference frequency; and in an RF receiver, a PLL may be used to recover the carrier frequency from the received signals. For another example, in a system composed of multiple IC chips, PLL's may be used in the chips for synchronization with one another, or to provide internal clock signals having precise timing relationships but higher frequencies than external signals.

Examples of conventional PLL's include linear PLL's, digital PLL's, and all-digital PLL's. These three types are illustrated in FIGS. 1-3, respectively, and briefly described below.

FIG. 1 shows the structure of a linear PLL, also known as an analog PLL or APLL. The linear PLL includes a phase detector 102, a loop filter 104, and a voltage controlled oscillator (VCO) 106. Phase detector 102 mixes an output signal of VCO 106 with a reference signal to generate a mixture signal containing a sum frequency component, i.e., a component reflecting the sum of the frequency of the output signal and the frequency of the reference signal, a difference frequency component, i.e., a component reflecting the difference between the frequency of the output signal and the frequency of the reference signal, and a phase difference component, i.e., a component reflecting the difference between the phase of the output signal and the phase of the reference signal. Loop filter 104 filters out the sum frequency component from the mixture signal, and outputs the difference frequency component and the phase difference component to VCO 106. VCO 106 outputs the output signal having an oscillation frequency determined by the frequency difference and the phase difference. The linear PLL is configured as a negative feedback loop such that when the frequency of the output signal is lower than that of the reference signal, the output of loop filter 104 controls VCO 106 to raise the frequency of the output signal. Conversely, when the frequency of the output signal is higher than that of the reference signal, the output of loop filter 104 controls VCO 106 to lower the frequency of the output signal. As a result, when the linear PLL is stabilized, the output signal of VCO 106 should have the same frequency and phase as the reference signal; in other words, the output signal of VCO 106 is locked to the reference signal.

FIG. 2 shows the structure of a digital PLL, often abbreviated as DPLL. The DPLL includes a phase and frequency detector (PFD) 202, a charge pump 204, a loop filter 206, a VCO 208 for generating an oscillation signal, and a frequency divider 210 for generating a divided frequency signal having a frequency that is 1/N of the frequency of the oscillation signal, where N is an integer. PFD 202 compares a divided frequency signal with a reference signal and provides a control signal to charge pump 204 indicating whether the frequency of the oscillation signal should increase or decrease. Charge pump 204 includes a charge storage component and outputs a voltage in proportion to the amount of charge stored in the charge storage component. Loop filter 206 filters out high frequency components in the output of charge pump 204. The frequency of the oscillation signal generated by VCO 208 is determined by the output voltage of charge pump 204 as filtered by loop filter 206. Frequency divider 210 receives the oscillation signal and generates the divided frequency signal. The DPLL is configured such that the oscillation signal has a frequency N times that of the reference signal. Thus, when the frequency of the oscillation signal is higher than N times the frequency of the reference signal, charge pump 204 operates to lower the frequency of the oscillation signal generated by VCO 208. Conversely, when the frequency of the oscillation signal is lower than N times the frequency of the reference signal, charge pump 204 operates to raise the frequency of the oscillation signal generated by VCO 208. Thus, when the DPLL is in a locked state, the frequency of the oscillation signal generated by VCO 208 should be N times the frequency of the reference signal. Frequency divider 210 may also be configured to output M/N of the frequency of the oscillation signal, where M, N are integers. Therefore, the DPLL has great flexibility to generate an oscillation signal having almost any frequency.

The APLL and DPLL respectively shown in FIGS. 1 and 2 both use a VCO. The VCO is an analog circuit, which occupies a large chip area and has poor noise immunity. In contrast, an all-digital PLL, or ADPLL, utilizes a digitally controlled oscillator (DCO) instead of a VCO. FIG. 3 shows the structure of an ADPLL. The ADPLL includes a PFD 302, a control unit 304, a DCO 306, and a frequency divider 308. PFD 302 compares an output signal of frequency divider 308 with a reference signal and provides a signal to control unit 304 indicating whether the frequency of the output signal should increase or decrease. Control unit 304 generates control signals based on the output of PFD 302 for controlling DCO 306 to adjust the frequency of an oscillation signal generated by DCO 306. Frequency divider 308 receives the oscillation signal and generates a signal having a frequency equal to 1/N of the frequency of the oscillation signal. When the ADPLL is in a locked state, the frequency of the oscillation signal generated by DCO 306 should be N times the frequency of the reference signal.

The ADPLL includes only digital components and only processes digital signals. Therefore, the ADPLL has better noise immunity than the APLL or DPLL. Moreover, in the APLL and DPLL, the frequency of the oscillation signal is adjusted solely based on the feedback of the oscillation signal to the phase detector or phase and frequency detector. In contrast, the ADPLL uses control unit 304 to control DCO 306 for adjusting the frequency of the oscillation signal. Once PDF 302 determines the frequency difference and phase difference, control unit 304 calculates the amount of frequency adjustment required for the oscillation signal. As a result, the ADPLL may reach a locked state more quickly than the APLL or DPLL.

A DCO generally includes a number of inverters forming a loop. FIG. 4A shows a configuration of a conventional DCO 400 including eight inverters 402, i.e., 402-1, 402-2, . . . , and a NAND gate 404. The eight inverters 402 and NAND gate 404 form a loop, such that the output of one of inverters 402 or NAND gate 404 is the input of a next one of inverters 402 or NAND gate 404 on the loop, as FIG. 4A shows. NAND gate 404 also receives an enable signal that enables DCO 400.

When the enable signal is "1", NAND gate 404 becomes an inverter, too, and the loop of DCO 400 becomes a positive feedback loop containing nine inverters. As a result, DCO 400 starts to oscillate. FIG. 4A shows that the output of inverter 402-4 is provided as the output of DCO 400. However, it is apparent that the output signal may be taken out at any point of the loop. DCO 400 shown in FIG. 4A is generally referred to as a double-edge-triggered DCO, because either a fall or a rise in a signal at any point of the loop would trigger a change in the output signal.

Because the period of the output oscillation signal is the total circuit delay of the loop, by changing the total circuit delay of the loop, the period and frequency of the oscillation signal can be adjusted. FIG. 4A shows that control signals are provided to each of inverters 402 for controlling the circuit delay thereof, and FIG. 4B illustrates one exemplary configuration of one of inverters 402 with a circuit delay controllable by external control signals. The configuration of FIG. 4B was disclosed by J. Dunning et al., *An All-Digital Phase-Locked Loop with 50-Cycle Lock Time Suitable for High-Performance Microprocessors*, IEEE Journal of Solid-State Circuits, vol. 30, no. 4, pp. 412-22, Apr. 1995. As FIG. 4B shows, inverter 402 includes a standard CMOS inverter 406 composed of a PMOS transistor 408 and an NMOS transistor 410. A number of PMOS transistors 412 connected in parallel are provided as the load on the side of PMOS transistor 408, and a number of NMOS transistors 414 connected in parallel are provided as the load on the side of NMOS transistor 410. The control signals are separately provided to the respective gates of PMOS transistors 412 and NMOS transistors 414 to select one or more of PMOS transistors 412 and the corresponding one or more of NMOS transistors 414.

PMOS transistors 412 and NMOS transistors 414 are provided in pairs and each pair has different dimensions than others. For example, gate widths of the pairs of PMOS transistors 412 and NMOS transistors 414 may increase by a factor of 2 from the smallest size to 256 times the smallest size, as indicated by the numbers 256, 128, . . . , in FIG. 4B. As a result, each one of PMOS transistors 412 has different capacitances in the on and off states thereof than the others, and each one of NMOS transistors 414 has different capacitances in the on and off states thereof than the others. Consequently, providing different control signals to select one or more different pairs of PMOS transistors 412 and NMOS transistors 414 results in a different circuit delay of inverter 402, and therefore, a different oscillation frequency of DCO 400.

The control signals for selecting PMOS transistors 412 and NMOS transistors 414 are generally binarily weighted, and may be collectively referred to as a control word. For example, assuming N=8, then there are 8 pairs of PMOS transistors 412 and NMOS transistors 414, which can produce $2^8$ different oscillation frequencies. A control word of 00000000 turns off all of PMOS transistors 412 and NMOS transistors 414, producing the maximum delay and therefore the lowest possible oscillation frequency; a control word of 11111111 turns on all of PMOS transistors 412 and NMOS transistors 414, producing the minimum delay and therefore the highest possible oscillation frequency; and any intermediate control word would select a combination of PMOS transistors 412 and NMOS transistors 414 that produce a corresponding intermediate oscillation frequency. Increasing the binary code by 1 results in a minimal increase in the oscillation frequency, which is defined as the resolution of the DCO. Apparently, the resolution of the DCO is determined by the smallest possible capacitance adjustment in the load of the inverters, e.g., the capacitance change in the smallest one of PMOS transistors 412 and NMOS transistors 414 between the on and off states.

Because transistors have different capacitances when they are turned on and off, DCO 400 shown in FIGS. 4A and 4B realizes different delays by adjusting a capacitive load of inverters 402 through selectively turning on and off transistors. In this sense, PMOS transistors 412 and NMOS transistors 414 may be referred to as variable capacitors (varactors) and, particularly, digitally controlled varactors (DCV's), because they are controlled by digital signals. In addition to transistors configured to provide different capacitances in their on and off states as shown in FIG. 4B, transistors may be configured in other manners as varactors to be used in DCO's. For example, FIG. 5A shows an inverter having a conventional DCV as the load thereof. In FIG. 5A, the DCV comprises a NOR gate coupled to receive the output of the inverter and a control signal D. The NOR gate comprises four transistors, including two NMOS transistors M1 and M2 and two PMOS transistors M3 and M4. The source of PMOS transistor M3 and the drain of PMOS transistor M4 are connected together but not connected to any bias voltage. Depending on the control signal D, the NOR gate exhibits different capacitances. For example, when D is 1, NMOS transistor M2 is on, the drain of PMOS transistor M3 is grounded, and the source of PMOS transistor M3 is floating; and when D is 0, PMOS transistor M4 is turned on, the source of PMOS transistor M3 is biased at the voltage of the positive power supply, and the drain of PMOS transistor M3 is either grounded (when the output of the inverter is 1) or at the potential of the positive power supply (when the output of the inverter is 0). As a result of these different bias voltages on the source and drain of PMOS transistor M3, the NOR gate exhibits different capacitances. Therefore, the delay of the circuit shown in FIG. 5A varies with the control signal D. FIG. 5B is a graph illustrating the change of the gate capacitance of PMOS transistor M3 with a voltage applied at the gate of PMOS transistor M3 under the two possibilities of the control signal D. The abscissa shows the voltage of the output, Vout, and the ordinate shows the capacitance of PMOS transistors M3 and the combined capacitance of PMOS transistors M1 and M3. The bolded line shows the capacitances when the control signal D is 1, and the non-bolded line shows the capacitances when the control signal D is 0. As FIG. 5B shows, the capacitance of M3 and the combined capacitance of M1 and M3 both when the control signal D changes. The frequency of a DCO using the inverter of FIG. 5A is determined by the delay of the inverter, which is in turn determined by the capacitance of the DCV averaged over the range of the output of the inverter, which is also the gate voltage of PMOS transistor M3. Therefore, the resolution of such a DCO is determined by the change in the average capacitance of the DCV when the control signal D changes between 1 and 0, which is smaller than a change in a gate capacitance of a transistor configured to operate in only on and off states, such as PMOS transistors 412 and NMOS transistors 414 shown in FIG. 4B. Consequently, the resolution of a DCO composed of inverters such as that shown in FIG. 5A is higher than DCO 400 as shown in FIGS. 4A and 4B.

FIG. 6A shows another conventional DCV 600 including an NMOS transistor 602 and a PMOS transistor 604. The source and drain of NMOS transistor 602 are connected together and coupled to receive a control signal D. The source and drain of PMOS transistor 604 are connected together and coupled to receive the invert, DB, of control signal D. The substrate of NMOS transistor 602 is grounded and the substrate of PMOS transistor 604 is coupled to a positive power supply. The respective gate capacitances of NMOS transistor 602 and PMOS transistor 604 are controlled by the control signal D and the invert DB thereof. FIG. 6B is a graph illustrating the change of the capacitance of DCV 600 with a gate voltage applied at the gates of NMOS transistor 602 and PMOS transistor 604 under different control signals D and DB. The abscissa shows the gate voltage of NMOS transistor 602 and PMOS transistor 604, and the ordinate ("Params") shows the capacitance of DCV 600. The bolded line labeled with Roman numeral I is a curve of the capacitance of DCV 600 when the control signal D is 1, and the non-bolded line labeled with Roman numeral II is a curve of the capacitance of DCV 600 when the control signal D is 0. As FIG. 6B shows, the capacitance of DCV 600 varies when the control signal D changes. Table I below lists the average, the range, and the linearity of the capacitance of DCV 600 under different control signals D and DB, where the linearity of the capacitance is calculated as the ratio of half of the range of capacitance to the average of the capacitance expressed in percentage.

TABLE I

| Reference | Control Signal D | Capacitance (fF) | | |
|---|---|---|---|---|
| | | Average | Range | Linearity |
| I | GND | 1.04 | 1.06-1.03 | ±1.5% |
| II | $V_{DD}$ | 1.78 | 1.97-1.51 | ±13% |

SUMMARY OF THE INVENTION

Consistent with embodiments of the present invention, there is provided a DCO including a pulse generator for generating a pulse signal upon an edge of a trigger signal, and at least one delay circuit coupled to delay the pulse signal generated by the pulse generator. The pulse generator is coupled to receive one of the delayed pulse signal from the at least one delay circuit and an enable signal as the trigger signal.

Consistent with embodiments of the present invention, there is also provided a DCO including a pulse generator for generating a pulse signal upon a trigger signal; a first delay circuit coupled to delay the pulse signal by a first delay amount to generate a first delayed signal; a second delay circuit coupled to delay the pulse signal by a second delay amount to generate a second delayed signal; and an edge combine circuit for generating an oscillation signal from the first delayed signal and the second delayed signal.

Consistent with embodiments of the present invention, there is also provided an ADPLL that includes a digitally controlled oscillator (DCO) for generating an oscillation signal, a frequency divider coupled to receive the oscillation signal and to generate a divided frequency signal, wherein a ratio of a frequency of the oscillation signal to a frequency of the divided frequency signal is a predetermined number; a control unit coupled to receive a reference signal having a reference frequency and the divided frequency signal; a coarse tuning part; and a fine tuning part. The DCO includes at least one delay circuit including at least one digitally controlled varactor (DCV), wherein the DCV includes a transistor having a gate, a source, a drain, and a substrate, wherein at least one of the gate, the source, the drain, and the substrate is coupled to receive one of two or more voltages, wherein at least one of the two or more voltages is not a power supply voltage or ground. The coarse tuning part includes a counter coupled to the control unit for counting cycles of the oscillation signal during one cycle of the reference signal, a comparator for comparing the counted number of cycles of the oscillation signal during one cycle of the reference signal with the predetermined number, a first successive approximation register (SAR) for generating a first control signal based on a result of the comparing of the counted number with the predetermined number, and a first up/down counter coupled to receive the first control signal for generating a first control word for adjusting the frequency of the oscillation signal. The fine tuning part includes a phase and frequency detector coupled to the control unit for comparing a phase of the divided frequency signal with a phase of the reference signal, a second SAR for generating a second control signal based on a result of the comparing of the phase of the divided frequency signal with that of the reference signal, and a second up/down counter coupled to receive the second control signal for generating a second control word for adjusting the frequency of the oscillation signal.

Consistent with embodiments of the present invention, there is further provided an all-digital phase-locked loop (ADPLL) that includes a digitally controlled oscillator (DCO) for generating an oscillation signal; a frequency divider coupled to receive the oscillation signal and to generate a divided frequency signal, wherein a ratio of a frequency of the oscillation signal to a frequency of the divided frequency signal is a predetermined number; a control unit coupled to receive a reference signal having a reference frequency and the divided frequency signal; a coarse tuning part; and a fine tuning part. The DCO includes a pulse generator for generating a pulse signal upon a trigger signal, a first delay circuit coupled to delay the pulse signal by a first delay amount to generate a first delayed signal, a second delay circuit coupled to delay the pulse signal by a second delay amount to generate a second delayed signal, and an edge combine circuit for generating the oscillation signal from the first delayed signal and the second delayed signal. The coarse tuning part includes a counter coupled to the control unit for counting cycles of the oscillation signal during one cycle of the reference signal, a comparator for comparing the counted number of cycles of the oscillation signal during one cycle of the reference signal with the predetermined number, a first successive approximation register (SAR) for generating a first control signal based on a result of the comparing of the counted number with the predetermined number, and a first up/down counter coupled to receive the first control signal for generating a first control word for adjusting the frequency of the oscillation signal. The fine tuning part includes a phase and frequency detector coupled to the control unit for comparing a phase of the divided frequency signal with a phase of the reference signal, a second SAR for generating a second control signal based on a result of the comparing of the phase of the divided frequency signal with that of the reference signal, and a second up/down counter coupled to receive the second control signal for generating a second control word for adjusting the frequency of the oscillation signal.

Consistent with embodiments of the present invention, there is provided a DCV including a transistor having a gate, a source, a drain, and a substrate, wherein at least one of the gate, the source, the drain, and the substrate is coupled to receive one of two or more voltages, wherein at least one of the two or more voltages is not a power supply voltage or ground.

Consistent with embodiments of the present invention, there is also provided a DCO including at least one delay circuit including at least one DCV. The DCV includes a transistor having a gate, a source, a drain, and a substrate, wherein at least one of the gate, the source, the drain, and the substrate is coupled to receive one of two or more voltages, wherein at least one of the two or more voltages is not a power supply voltage or ground.

Additional features and advantages of the invention will be set forth in part in the description which follows, and in part will be apparent from that description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain features, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Consistent with embodiments of the present invention, there are provided all-digital phase-locked loops (ADPLL's) using digitally controlled varactors that provide fine resolution. The ADPLL's consistent with embodiments of the present invention also use digitally controlled oscillators (DCO's) that include plural delay circuits for providing adjustable duty cycles. Descriptions of the DCV's, the DCO's, and the ADPLL's consistent with embodiments of the present invention are provided below.

1. Digitally Controlled Varactors (DCV's)

Figure 7A:
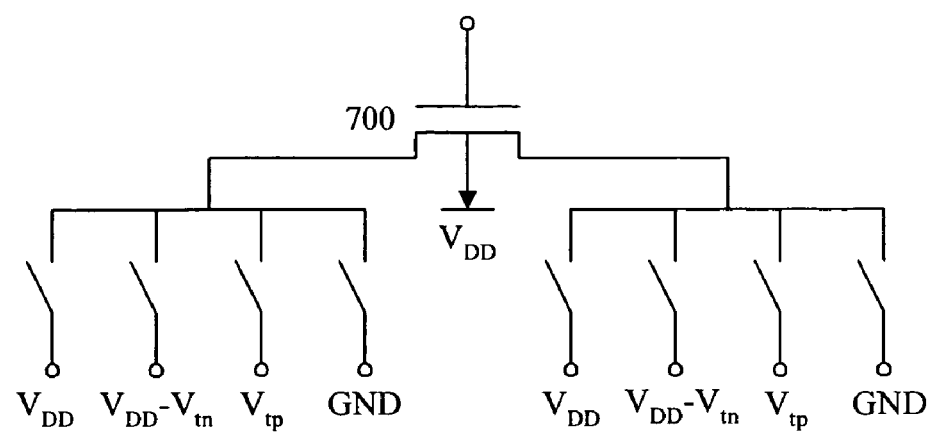
FIG. 7A shows a DCV consistent with a first embodiment of the present invention.

FIG. 7A shows a PMOS transistor 700 configured as a varactor consistent with a first embodiment of the present invention. PMOS transistor 700 has a gate, a source, a drain, and a substrate. The substrate of PMOS transistor 700 is connected to a positive power supply $V_{DD}$. The source and drain of PMOS transistor 700 are each coupled to receive one of four bias voltages, i.e., $V_{DD}$, $V_{DD}$-$V_{tn}$, $V_{tp}$, and GND, where $V_{tp}$ is the threshold voltage of PMOS transistor 700, $V_{tn}$ is the threshold voltage of an NMOS transistor having dimensions similar to those of PMOS transistor 700, and GND is ground.

Figure 7B:
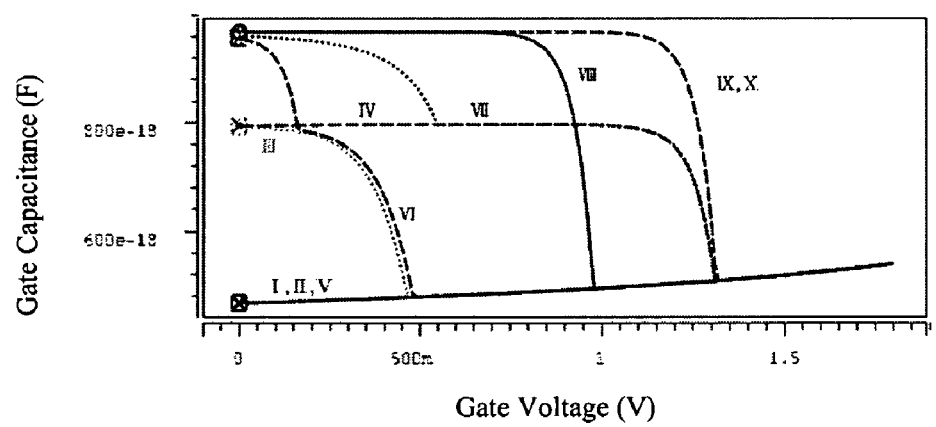
FIG. 7B is a graph illustrating capacitance characteristics of the DCV in FIG. 7A.

By applying different combinations of bias voltages on the source and drain of PMOS transistor 700, PMOS transistor 700 may have different gate capacitances. FIG. 7B is a graph showing the change of the gate capacitance of PMOS transistor 700 with a gate voltage applied to the gate of PMOS transistor 700, under different source and drain bias conditions. The abscissa shows the gate voltage and the ordinate shows the gate capacitance. Roman numerals I-X represent different source and drain bias conditions, as given in Table II below. Table II also shows simulation results of the gate capacitance of PMOS transistor 700 under different source and drain biases of PMOS transistor 700. As shown in Table II and FIG. 7B, by varying the source and drain biases of PMOS transistor 700, seven different gate capacitance curves may be obtained. Thus, the configuration of PMOS transistor 700 shown in FIG. 7A may be used in an inverter to provide seven different delays, and may be used in a DCO to allow the generation of at least seven different oscillation frequencies.

TABLE II

| | | | Capacitance (fF) | | |
|---|---|---|---|---|---|
| Reference | Drain | Source | Average | Range | Linearity |
| I | GND | GND | 0.50 | 0.54-0.47 | ±7% |
| II | $V_{tp}$ | GND | 0.50 | 0.54-0.47 | ±7% |
| III | $V_{DD}$ - $V_{tn}$ | GND | 0.55 | 0.79-0.48 | ±28% |
| IV | $V_{DD}$ | GND | 0.70 | 0.79-0.51 | ±20% |
| V | $V_{tp}$ | $V_{tp}$ | 0.50 | 0.54-0.47 | ±7% |
| VI | $V_{DD}$ - $V_{tn}$ | $V_{tp}$ | 0.56 | 0.96-0.48 | ±43% |
| VII | $V_{DD}$ | $V_{tp}$ | 0.75 | 0.96-0.51 | ±30% |
| VIII | $V_{DD}$ - $V_{tn}$ | $V_{DD}$ - $V_{tn}$ | 0.85 | 0.97-0.48 | ±29% |
| IX | $V_{DD}$ | $V_{DD}$ - $V_{tn}$ | 0.95 | 0.97-0.52 | ±24% |
| X | $V_{DD}$ | $V_{DD}$ | 0.95 | 0.97-0.52 | ±24% |

Figure 8A:
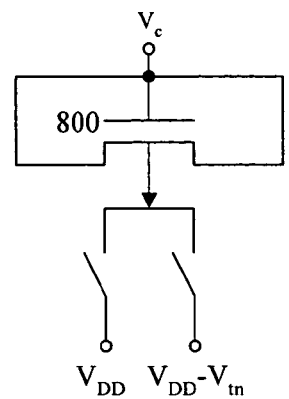
FIG. 8A shows a DCV consistent with a second embodiment of the present invention.

FIG. 8A shows a PMOS transistor 800 configured as a varactor consistent with a second embodiment of the present invention. PMOS transistor 800 has a gate, a source, a drain, and a substrate. The source and drain of PMOS transistor 800 are both connected to the gate of PMOS transistor 800. The substrate of PMOS transistor 800 is coupled to receive one of two bias voltages, i.e., $V_{DD}$ and $V_{DD}$-$V_{tn}$.

Figure 8B:
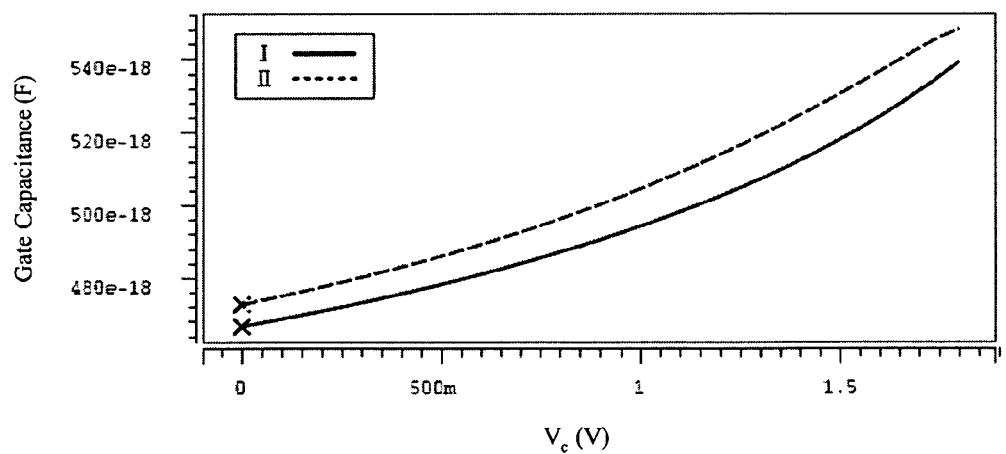
FIG. 8B is a graph illustrating capacitance characteristics of the DCV in FIG. 8A.

By varying the substrate bias voltage, PMOS transistor 800 may have different gate capacitances. FIG. 8B is a graph showing the change of the gate capacitance of PMOS transistor 800 with a voltage applied to the gate of PMOS transistor 800, $V_c$, under different substrate biases. The abscissa shows the gate voltage and the ordinate shows the gate capacitance. Roman numerals I and II represent different substrate voltages, as given in Table III below. Table III also shows simulation results of the gate capacitance of PMOS transistor 800 under different source and drain biases of PMOS transistor 800. The curves corresponding to substrate bias voltages I and II are denoted as solid and broken lines in FIG. 8B. As shown in Table III and FIG. 8B, by providing two possible substrate biases to PMOS transistor 800, two different gate capacitance curves may be obtained. Thus, the configuration of PMOS transistor 800 shown in FIG. 8A may be used in an inverter to provide two different circuit delays, and may be used in a DCO to allow the generation of at least two different oscillation frequencies.

TABLE III

| | | Capacitance (fF) | | |
|---|---|---|---|---|
| Reference | Substrate Bias | Average | Range | Linearity |
| I | $V_{DD}$ | 1.34 | 1.11-1.45 | ±13% |
| II | $V_{DD} - V_{tn}$ | 1.41 | 1.14-1.49 | ±12% |

Figure 9A:
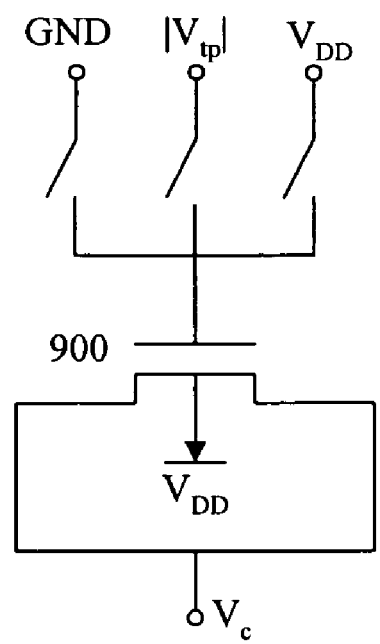
FIG. 9A shows a DCV consistent with a third embodiment of the present invention.

FIG. 9A shows a PMOS transistor 900 configured as a varactor consistent with a third embodiment of the present invention. PMOS transistor 900 has a gate, a source, a drain, and a substrate. The source and drain of PMOS transistor 900 are connected to each other. The gate of PMOS transistor 900 is coupled to receive one of three bias voltages, i.e., $V_{DD}$, $|V_{tp}|$, and GND. The substrate of PMOS transistor 900 is biased at $V_{DD}$.

Figure 9B:
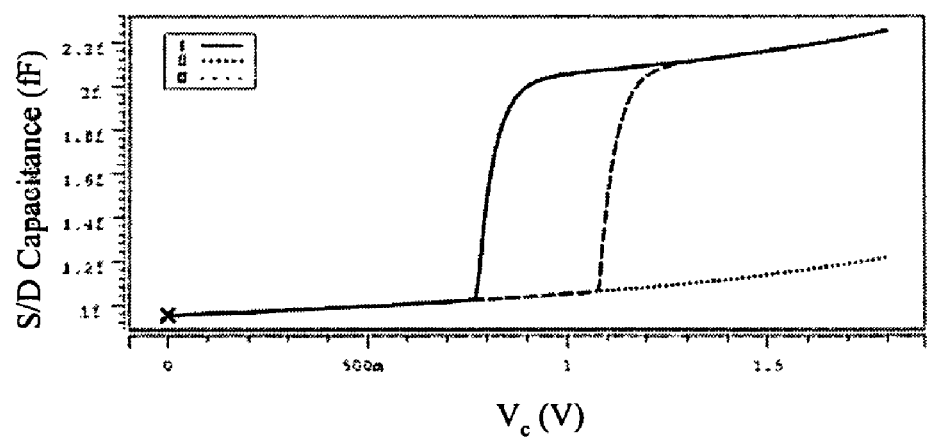
FIG. 9B is a graph illustrating capacitance characteristics of the DCV in FIG. 9A.

By varying the gate bias voltage, PMOS transistor 900 may have different source/drain (S/D) capacitances. FIG. 9B is a graph showing the change of the S/D capacitance of PMOS transistor 900 with a voltage applied to the source and drain of PMOS transistor 900, $V_c$, under different gate biases. The abscissa shows the S/D voltage and the ordinate shows the S/D capacitance. Roman numerals I, II, and III represent different gate voltages, as given in Table IV below. Table IV also shows simulation results of the gate capacitance of PMOS transistor 900 under different source and drain biases of PMOS transistor 900. The curves corresponding to gate bias voltages I, II, and III are respectively denoted as solid, dashed, and dotted lines in FIG. 9B. As shown in Table IV and FIG. 9B, by providing three possible gate biases to PMOS transistor 900, three different S/D capacitance curves may be obtained. Thus, the configuration of PMOS transistor 900 shown in FIG. 9A may be used in an inverter to provide three different circuit delays, and may be used in a DCO to allow the generation of at least three different oscillation frequencies.

TABLE IV

| | | Capacitance (fF) | | |
|---|---|---|---|---|
| Reference | Gate Bias | Average | Range | Linearity |
| I | GND | 1.95 | 0.95-2.25 | ±33% |
| II | $V_{tp}$ | 1.62 | 0.95-2.25 | ±40% |
| III | $V_{DD}$ | 1.47 | 0.95-1.22 | ±9% |

FIGS. 7A, 8A, and 9A show only PMOS transistors. However, an NMOS transistor can also be configured as a varactor in the same manner as shown in these figures. Also, FIGS. 7A, 8A, and 9A show such exemplary bias voltages as $V_{DD}$, $V_{DD}-V_{tn}$, $V_{tp}$, and GND, because these voltages are easily obtained in a circuit. It is to be understood that these voltages are only exemplary and other voltages may also be adopted to provide variable capacitances.

Figure 1:
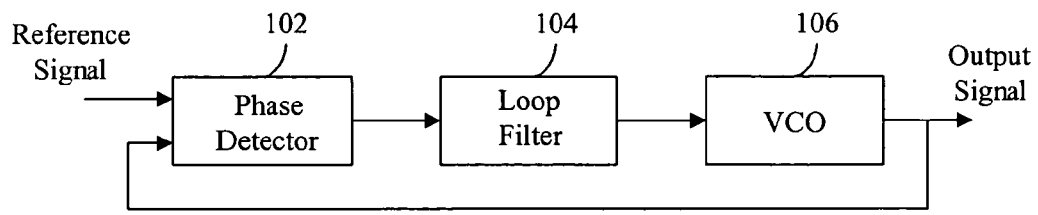
FIG. 1 shows a conventional linear phase-locked loop (PLL)
Figure 2:
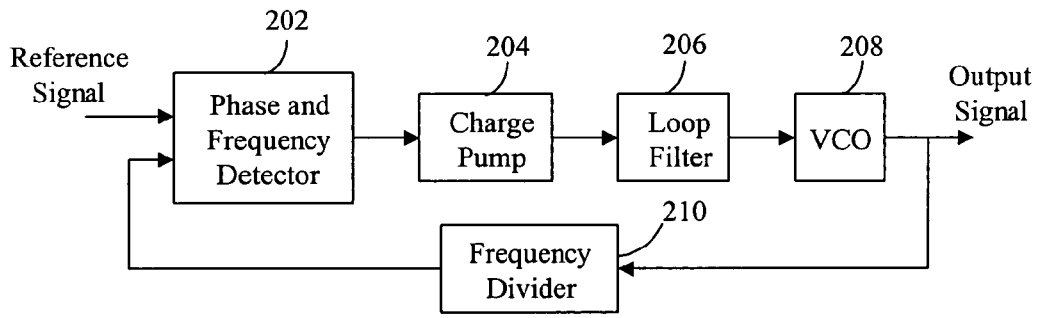
FIG. 2 shows a conventional digital PLL (DPLL)
Figure 3:
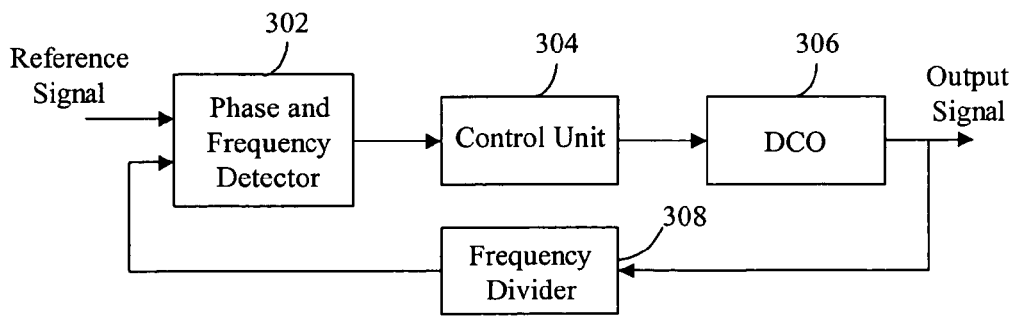
FIG. 3 shows a conventional all digital PLL (ADPLL)
Figure 4A:
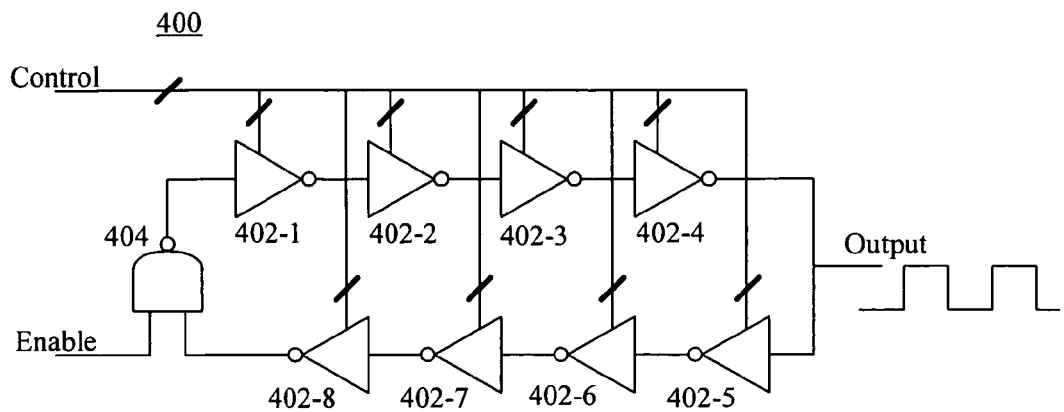
FIG. 4A shows a conventional digitally controlled oscillator (DCO) including several inverters.
Figure 6A:
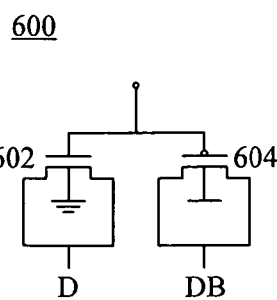
FIG. 6A shows another conventional DCV.
Figure 6B:
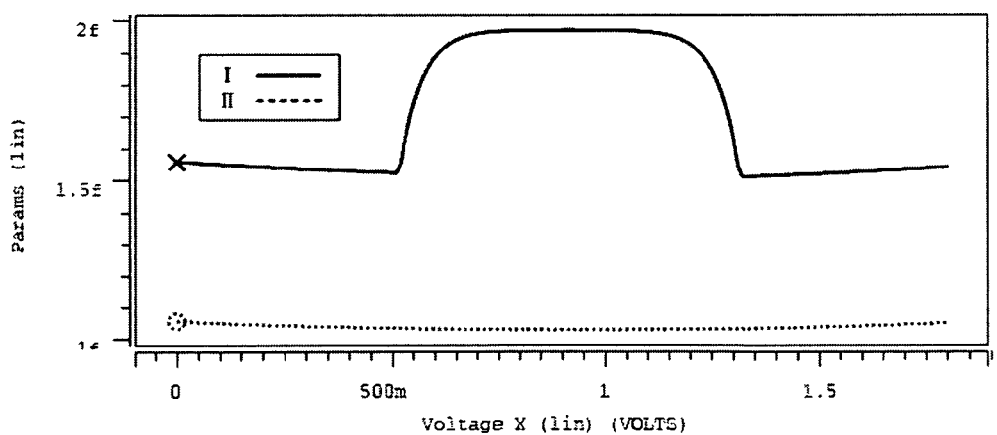
FIG. 6B is a graph illustrating capacitance characteristics of the conventional DCV in FIG. 6A.

As compared to conventional DCV's such as that shown in FIG. 6A, the DCV's consistent with embodiments of the present invention have capacitances variable with a finer resolution. For example, the DCV shown in FIG. 6A has an average capacitance difference of about 0.74 fF when the control signal D changes from 0 to 1. In contrast, the average capacitance of the DCV shown in FIG. 7A changes from about 0.50 fF to about 0.95 fF, over a range of about 0.45 fF; the average capacitance of the DCV shown in FIG. 8A changes from about 1.34 fF to about 1.41 fF, over a range of only about 0.07 fF; and the average capacitance of the DCV shown in FIG. 9A changes from about 1.47 fF to about 1.95 fF, over a range of only about 0.48 fF. Thus, the DCV's consistent with the present invention provide smaller ranges of capacitance change and may be used in a DCO to provide a finer resolution. For example, the DCV's consistent with embodiments of the present invention may be used as the load of inverters in a ring oscillator such as DCO 400 shown in FIG. 4A to allow for finer frequency adjustments of DCO 400.

2. Digitally Controlled Oscillator (DCO)

Consistent with embodiments of the present invention, there is also provided single-edge-triggered DCO's (SET-DCO), as illustrated in FIGS. 10 and 11A-11E.

Figure 10:
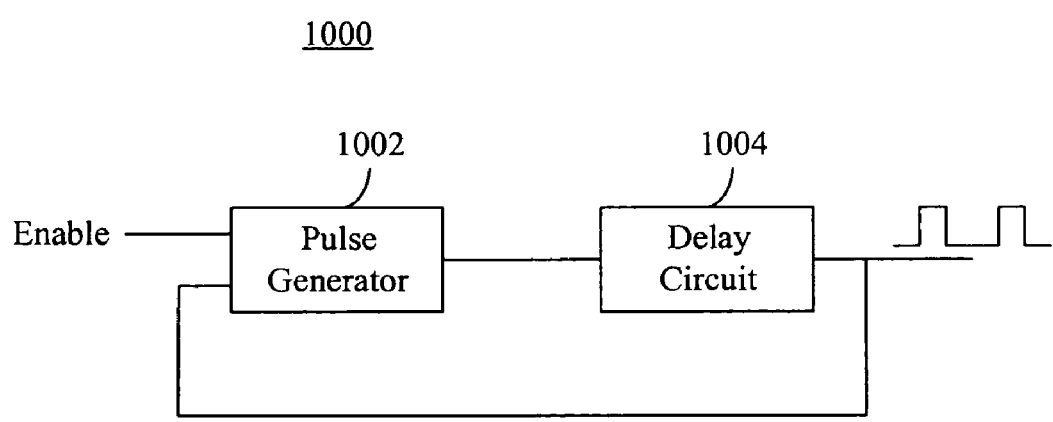
FIG. 10 shows a DCO consistent with embodiments of the present invention.

FIG. 10 shows a DCO 1000 that includes a pulse generator 1002 and a delay circuit 1004. Pulse generator 1002 receives an enable signal and the output of delay circuit 1004, and generates a pulse signal on a rising edge of one of the two inputs. Delay circuit 1004 is coupled to receive the pulse signal generated by pulse generator 1002 and delays the pulse signal by a certain amount of time. Delay circuit 1004 may comprise inverters with DCV's such as the conventional DCV's shown in FIG. 5A or 6A, or the DCV's consistent with embodiments of the present invention.

DCO 1000 is initialized by providing an enable signal, and selecting the enable signal as the input of pulse generator 1002 to generate a first pulse signal. Thereafter, DCO 1000 starts to oscillate as the pulse signal delayed by delay circuit 1004 is fed back to pulse generator 1002 and selected as the trigger for generating the next pulse signal, and so on.

If the time delay of pulse generator 1002 is $T_p$ and the time delay of delay circuit 1004 is $T_d$, then the frequency of the output oscillation signal of DCO 1000 is $1/(T_p+T_d)$, and the duty cycle of the output oscillation signal is determined by the frequency thereof and the duration of each pulse signal generated by pulse generator 1002.

Figure 11A:
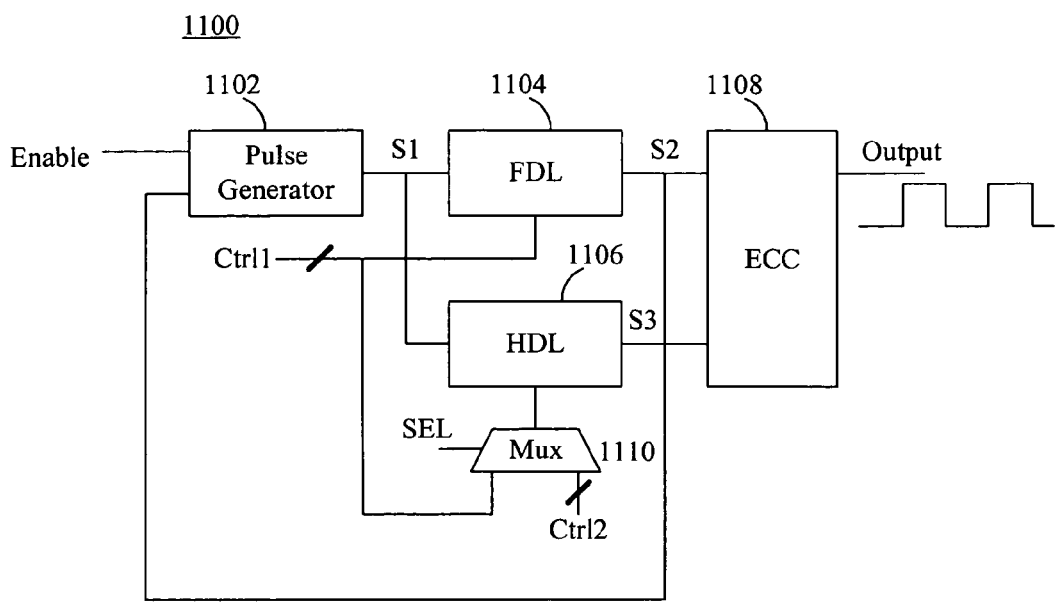
FIGS. 11A-11E illustrate another DCO consistent with embodiments of the present invention.

Consistent with embodiments of the present invention, there is also provided a SET-DCO using two delay circuits to provide adjustable duty cycles, such as SET-DCO 1100 shown in FIG. 11A.

Referring to FIG. 11A, SET-DCO 1100 includes a pulse generator 1102, a full-delay line (FDL) circuit 1104, a half-delay line (HDL) circuit 1106, an edge-combination circuit (ECC) 1108, and a multiplexer 1110. Pulse generator 1102 receives an enable signal and the output of FDL circuit 1104. Pulse generator 1102 generates a pulse signal on a rising edge of one of the two inputs. FDL circuit 1104 is coupled to receive the pulse signal generated by pulse generator 1102 and delays the pulse signal by a first delay amount. The pulse signal delayed by FDL 1104 is fed back to pulse generator 1102. Thus, after the generation of a first pulse signal upon the rising edge of the enable signal, the pulse signal delayed by FDL 1104 triggers pulse generator 1102 to generate subsequent pulse signals, and the loop formed of pulse generator 1102 and FDL circuit 1104 starts to oscillate. A first control word Ctrl1 is provided to FDL circuit 1104 to control the first delay amount, thereby adjusting the oscillation frequency of SET-DCO 1100.

HDL circuit 1106 is coupled to receive the pulse signal generated by pulse generator 1102 and delays the pulse signal by a second delay amount. The second delay amount is controlled by either first control word Ctrl1 or a second control word Ctrl2, selectable by MUX 1110 controlled by a selection signal SEL. ECC 1108 receives the pulse signal delayed by FDL 1104 and the pulse signal delayed by HDL 1106, and outputs a signal that changes state upon an edge, i.e., either a rising edge or a falling edge, of either input. Thus, by adjusting the delays of FDL circuit 1104 and HDL circuit 1106, the duty cycle of the output signal of ECC 1108 may be adjusted. When first control word Ctrl1 is selected, the duty cycle only depends on the circuit configuration of FDL circuit 1104 and HDL 1106 and is independent of first control word Ctrl1. However, second control word Ctrl2 may be selected to provide more flexibility in adjusting the duty cycle of the output signal.

Figure 11B:
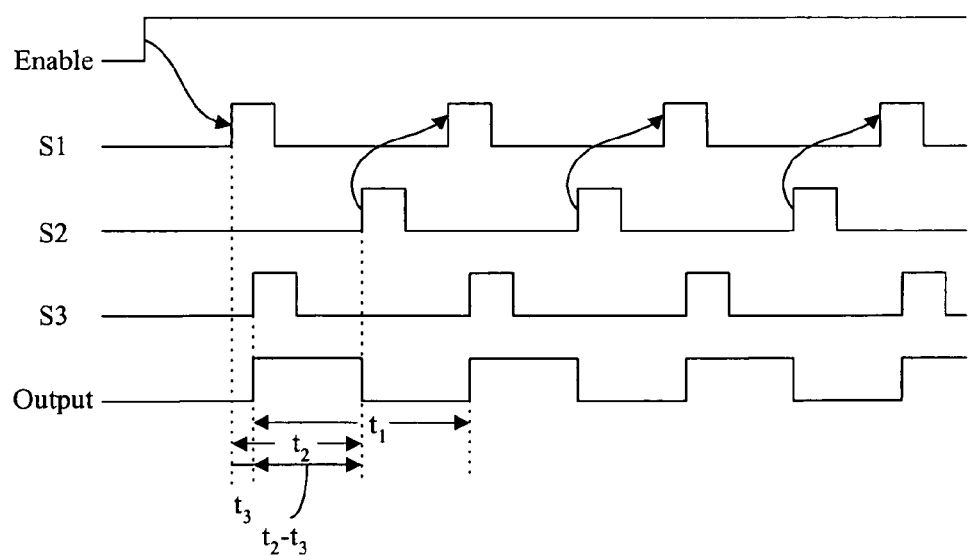

FIG. 11B shows a sequence of signals in SET-DCO 1100 for illustrating the operation thereof. Referring to FIGS. 11A and 11B, signal S1 is the output of pulse generator 1102, signal S2 is the output of FDL circuit 1104, signal S3 is the output of HDL circuit 1106, and signal Output is the output of ECC 1108. Times $t_1$, $t_2$, and $t_3$ are the circuit delays of pulse generator 1102, FDL circuit 1104, and HDL circuit 1106, respectively. As shown in FIG. 11B, the enable signal is first triggered so that a first pulse signal is generated by pulse generator 1102. Afterwards, the output of FDL circuit 1104, S2, is fed back to trigger the generation of subsequent pulse signals, thereby maintaining the oscillation of SET-DCO 1100. As is apparent from FIG. 11B, the oscillation of SET-DCO 1100 is maintained through the triggering of pulse generator 1102 only on one edge, e.g., a rising edge, of the output signal S2 of FDL circuit 1104, from which the name of single-edge-triggered DCO is derived.

The output of ECC 1108 is a signal that switches states upon the rising edge of both the output of FDL circuit 1104 and the output of HDL circuit 1106. As shown in FIG. 11B, the duty cycle of the output of ECC 1108 is the ratio of $t_2-t_3$ to the oscillation period, $t_1$. Therefore, by adjusting the delay $t_2$ of FDL circuit 1104 and the delay $t_3$ of HDL circuit 1106, the duty cycle of the oscillation signal of SET-DCO 1100 can be adjusted. For example, if $t_2-t_3=t_1/2$, then the duty cycle is 50%.

Figure 5A:
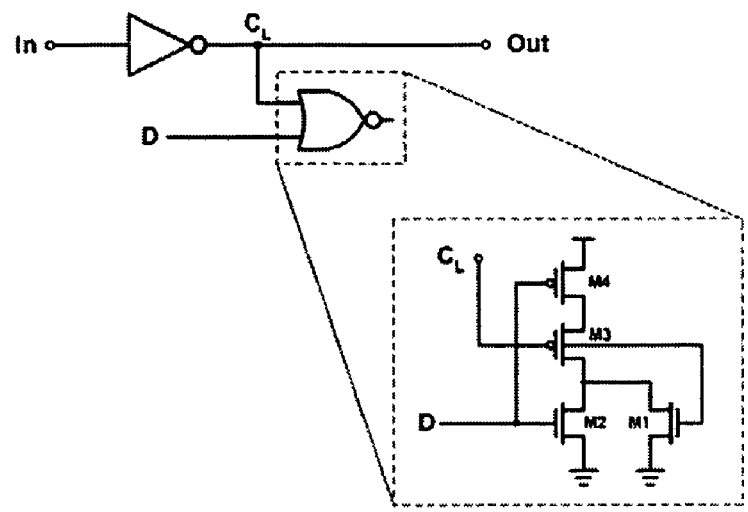
FIG. 5A shows an inverter with a conventional digitally controlled varactor (DCV) as a load.
Figure 5B:
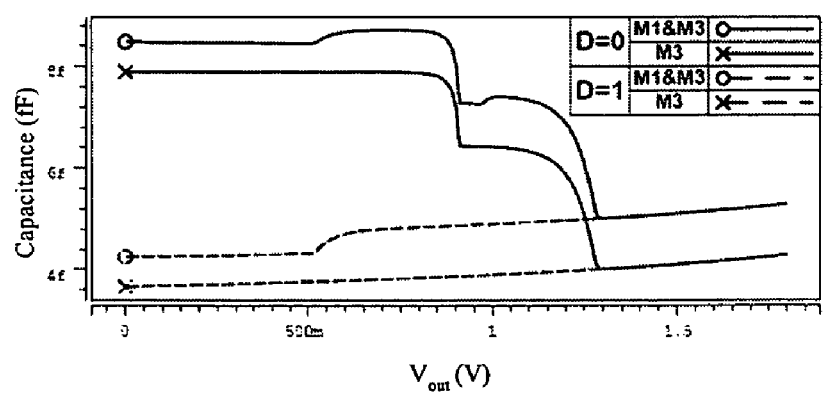
FIG. 5B is a graph illustrating capacitance characteristics of the conventional DCV in FIG. 5A.
Figure 11C:
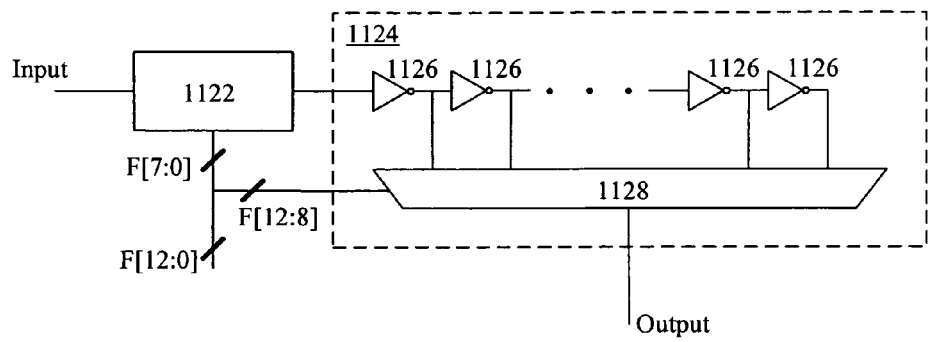
Figure 11D:
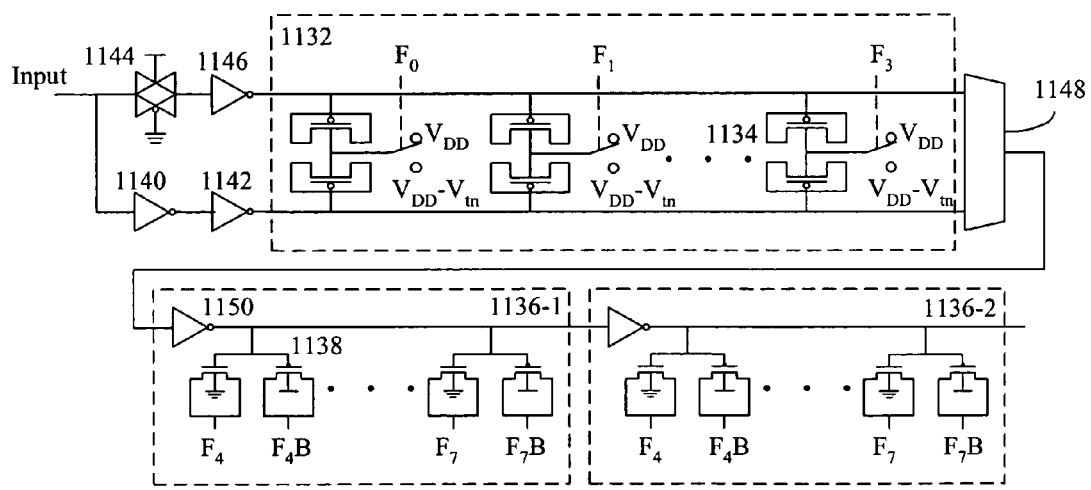

The delay circuits, i.e., FDL circuit 1104 and HDL circuit 1106, may comprise inverters with DCV's such as the conventional DCV's shown in FIG. 5A or 6A, or the DCV's consistent with embodiments of the present invention. FIGS. 11C and 11D show an exemplary configuration of HDL circuit 1106.

Referring to FIG. 11C, HDL circuit 1106 includes a fine tuning circuit 1122 and a coarse tuning circuit 1124. FIG. 11C shows as an example a 13-bit control word F[12:0], i.e., $F_{12}$~$F_0$, provided to adjust the delay of HDL circuit 1106. In particular, several of the most significant bits of the control word, e.g., F[12:8], are provided to coarse tuning circuit 1124 for adjusting the delay thereof, and several of the least significant bits of the control word, e.g., F[7:0], are provided to fine tuning circuit 1122 for adjusting the delay thereof. FIG. 11C shows that coarse tuning circuit 1124 includes a series of inverters 1126 providing increasing delays to the signal output of fine tuning circuit 1122. A multiplexer 1128 is controlled by the most significant bits of the control word, i.e., F[12:8], to select the output of one of inverters 1126 as the output of HDL circuit 1106.

Fine tuning circuit 1122 may comprise buffer circuits formed of inverters with high-resolution DCV's such as those shown in FIGS. 5A, 6A, 8A, 9A, and 10A. FIG. 11D shows that fine tuning circuit 1122 includes two types of delay circuits connected in series. A first delay circuit 1132 uses DCV's 1134 configured in the same manner as DCV 800 shown in FIG. 8A. A second delay circuit 1136 uses DCV's 1138 configured in the same manner as DCV 600 shown in FIG. 6A. FIG. 11D shows that fine tuning circuit 1122 includes one of first delay circuit 1132 and two of second delay circuits 1136, i.e., circuits 1136-1 and 1136-2. However, depending on the desired tuning range and the operation range of SET-DCO 1100, the number of these different types of DCV's may vary.

As FIG. 11D shows, first delay circuit 1132 includes DCV's 1134 connected as back-to-back pairs for delaying both the input signal and the invert of the input signal, where the input signal is buffered through two serially connected inverters 1140 and 1142, and the invert of the input signal is generated through a pass gate 1144 and an inverter 1146. The input signal and the invert thereof are each delayed by DCV's 1134, and selectively output through a multiplexer 1148. Because DCV's 1134 have the finest resolution as compared to other delay elements in SET-DCO 1100, the substrate biases of DCV's 1134 are controlled by several of the least significant bits of the control word, e.g., F[3:0]. Also, by providing DCV's 1134 in back-to-back pairs to delay both the input signal and the invert thereof, the substrate of DCV's 1134 is maintained at a stable potential even if one of DCV's 1134 is floating at some point of time. Therefore, the configuration of DCV's 1134 as shown in FIG. 11D, referred to here as a differential configuration, improves circuit stability.

FIG. 11D also shows that the second type of delay circuit 1136 includes DCV's 1138 provided as the load of an inverter 1150. DCV's 1138 are controlled by the remaining intermediate bits of the control word, i.e., F[7:4].

Thus, as described above, by providing an appropriate control word, e.g., F[12:0], the delay of HDL circuit 1106 may be adjusted. The delays provided by inverters 1126 are of greater orders of magnitude than the delays provided by DCV's 1134 or 1138. DCV's 1134 have the highest resolution as compared to the other elements in SET-DCO 1100. Therefore, the resolution of SET-DCO 1100 is determined by the delay of DCV's 1134.

FIG. 11D shows that DCV's consistent with the second embodiment of the present invention and such conventional DCV's as shown in FIG. 6A are used to construct HDL 1106. However, other types of DCV's, such as those disclosed above consistent with the first and third embodiments of the present invention, may also be used. One skilled in the art should now appreciate how to construct a delay circuit with the other types of DCV's, such as DCV 700 or DCV 900, or the conventional DCV shown in FIG. 5A.

Figure 11E:
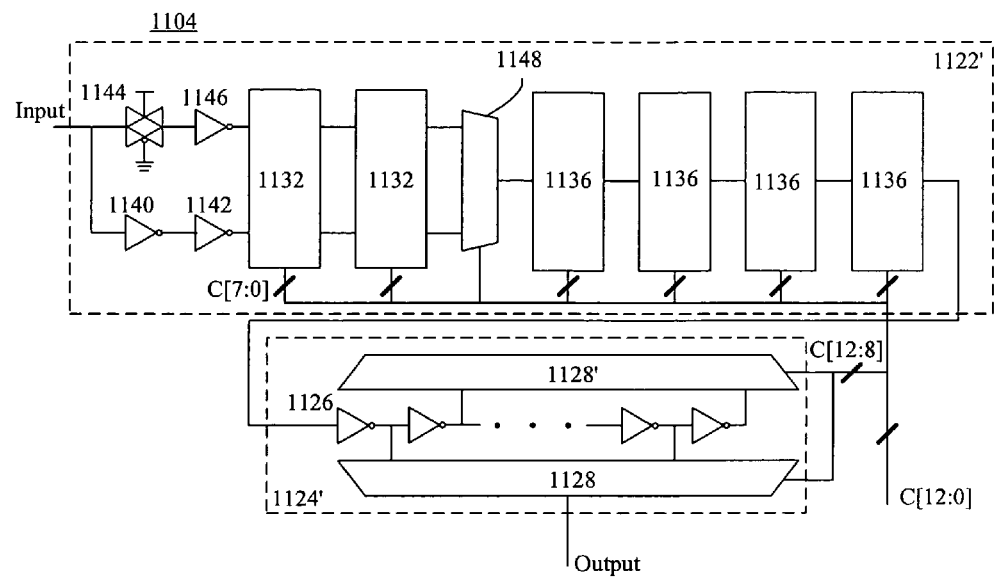

FDL circuit 1104 may be constructed in a manner similar to HDL circuit 1106, simply by including more delay elements such as DCV's 1134 and 1138 or by including a greater number of first delay circuits 1132 and/or second delay circuits 1136. In one aspect, FDL circuit 1104 may be configured to provide a delay twice that of HDL circuit 1106. For example, as shown in FIG. 11E, FDL circuit 1104 includes a fine tuning circuit 1122' having two of first delay circuits 1132 and four of second delay circuits 1136, and a coarse tuning circuit 1124' having twice the amount of inverters 1126 in coarse tuning circuit 1124' in HDL circuit 1106, and an additional dummy multiplexer 1128'. Dumy multiplexer 1128' has the same structure as multiplexer 1128. Dummy multiplexer 1128' and multiplexer 1128 are alternatively coupled to the outputs of inverters 1126, as shown in FIG. 11E.

FIG. 11E also shows a 13-bit control word C[12:0] is provided to FDL circuit 1104 to control the delay thereof. The control word C[12:0] may or may not be the same as the control word F[12:0] provided to HDL circuit 1106. As discussed above, when the same control word is provided to both FDL circuit 1104 and HDL circuit 1106, the duty cycle only depends on the circuit configuration of FDL circuit 1104 and HDL 1106 regardless what the control word is. If, however, different control words are provided to FDL circuit 1104 and HDL circuit 1106, greater flexibility in adjusting the duty cycle of the output signal may be achieved through the separate control of FDL circuit 1104 and HDL circuit 1106.

3. All-Digital PLL (ADPLL)

Figure 12:
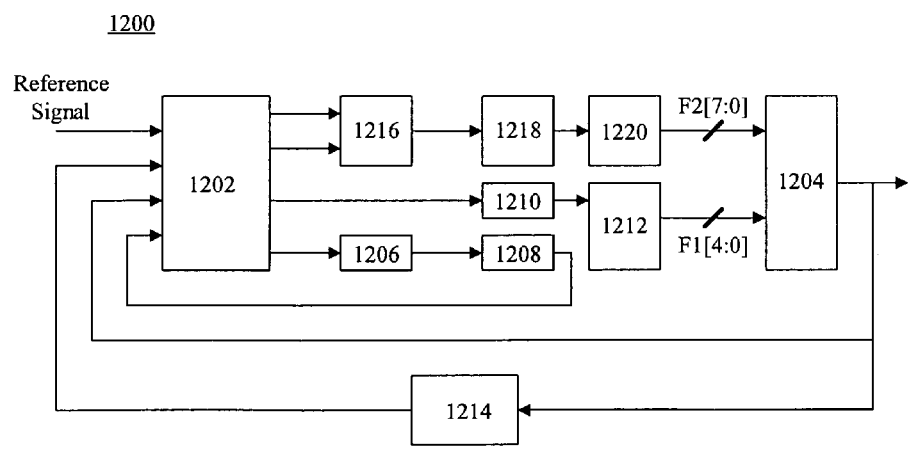
FIG. 12 illustrates an ADPLL consistent with embodiments of the present invention.

Consistent with embodiments of the present invention, there are further provided ADPLL's with high resolutions and variable duty cycles using SET-DCO's such as SET-DCO 1100 shown in FIG. 11A. FIG. 12 shows the structure of an ADPLL 1200 consistent with embodiments of the present invention.

As shown in FIG. 12, ADPLL 1200 includes a control unit 1202 and a DCO 1204. DCO 1204 has a structure similar to that of SET-DCO 1100. Control unit 1202 receives a reference signal and controls DCO 1204 to provide an oscillation signal having a frequency that is N times the frequency of the reference signal, or the reference frequency, where N is an integer.

Control unit 1202 controls DCO 1204 through two paths, a coarse tuning path and a fine tuning path. The coarse tuning path includes a counter 1206, a comparator 1208, a first successive approximation register (SAR) 1210, and a first up/down counter 1212. The oscillation signal generated by DCO 1204 is provided to control unit 1202. Counter 1206 is connected to control unit 1202 to count the cycles of the oscillation signal during one cycle of the reference signal. Comparator 1208 compares the number of cycles of the oscillation signal during one cycle of the reference signal with N. If the number of cycles of the oscillation signal during one cycle of the reference signal is equal to N, then coarse tuning is accomplished. Otherwise, first SAR 1210 generates a control signal based on the comparison performed by comparator 1208, and provides the control signal to first up/down counter 1212 indicating the desired amount of frequency change in the oscillation signal generated by DCO 1204. First SAR 1210 is configured to provide efficient adjustment of the frequency of the oscillation signal generated by DCO 1204. For example, each time an adjustment is required in the frequency of the oscillation signal, the amount of frequency change in the oscillation signal dictated by the control signal generated by first SAR 1210 decreases monotonically so that the oscillation frequency approaches the desired frequency, rather than takes much time swinging from one side of the desired frequency to the other. SAR's are well-known in the art and therefore detailed descriptions are omitted here. In response to the control signal generated by first SAR 1210, first up/down counter 1212 generates a first control word F1 to adjust the oscillation frequency of DCO 1204. FIG. 12 shows as an example that first control word F1 contains 5 bits, i.e., F1 [4:0].

The fine tuning path includes a frequency divider 1214, a PFD 1216, a second SAR 1218, and a second up/down counter 1220. Frequency divider 1214 receives the oscillation signal generated by DCO 1204, and generates a signal having a frequency equal to 1/N of the frequency of the oscillation signal. The signal having the divided frequency is fed back to control unit 1202. PFD 1216 is connected to control unit 1202 to measure the phase difference between the reference signal and the output of frequency divider 1214. Based on the measured phase difference, second SAR 1218 generates a control signal and provides the control signal to second up/down counter 1220. In response to the control signal generated by second SAR 1218, second up/down counter 1220 generates a second control word F2 to adjust the oscillation frequency of DCO 1204. FIG. 12 shows as an example that second control word F2 contains 8 bits, i.e., F2[7:0]. When the reference signal and the output of frequency divider 1214 are synchronized, ADPLL 1200 is locked.

Instead of dividing the frequency of the oscillation signal by N, frequency divider 1214 may also be configured to generate a signal having a frequency that is 1/N times the frequency of the oscillation signal to provide greater flexibility in the oscillation frequency.

The first control word F1 generated by first up/down counter 1212 and the second control word F2 generated by second up/down counter 1220 together control the oscillation frequency of DCO 1204. For example, referring to FIGS. 11C, 11E, and 12, and consistent with the present invention, the first control word F1 and the second control word F2 may combine into one 13-bit control word as control word C in FIG. 11E to control FDL circuit 1104 and also as control word F in FIG. 11C to control HDL circuit 1106. The first control word F1 constitutes the several most significant bits of control word C or F, and the second control word F2 constitutes the several least significant bits of control word C or F. In other words, F1[4:0] becomes C[12:8] or F[12:8], and F2[7:0] becomes C[7:0] or F[7:0]. Because, as described above, F[12:8] and C[12:8] adjust the frequency of DCO 1100 in a greater order of magnitude than F[7:0] and C[7:0], the coarse tuning path in ADPLL 1200 adjusts the frequency of the oscillation signal in a greater order of magnitude than the fine tuning path.

The operation of ADPLL 1200 is next described. First, ADPLL 1200 is initialized by resetting all components therein with a reset signal. After the reset, DCO 1204 starts to oscillate. Next, frequency acquisition is performed through coarse tuning. The oscillation frequency of DCO 1204 is measured by counting the cycles of the oscillation signal generated by DCO 1204 during one cycle of the reference signal and comparing the counted number of cycles of the oscillation signal with N. If the counted number is greater than or lower than N, then the oscillation frequency is higher than or lower than N times the reference frequency, and first SAR 1210 and first up/down counter 1212 operate to adjust the oscillation frequency of DCO 1204 accordingly. If the counted number is equal to N, then the oscillation frequency is approximately N times the reference frequency, and frequency acquisition is accomplished. Next, phase acquisition is performed through fine tuning. The frequency of oscillation signal generated by DCO 1204 is divided by frequency divider 1214 before being fed back to control unit 1202. PFD 1216 compares the oscillation signal at the divided frequency with the reference signal to measure the phase difference therebetween. If the phases of the two are different, second SAR 1218 and second up/down counter 1220 operate to adjust the oscillation frequency of DCO 1204 accordingly, until the oscillation signal at the divided frequency is synchronized with the reference signal.

Figure 4B:
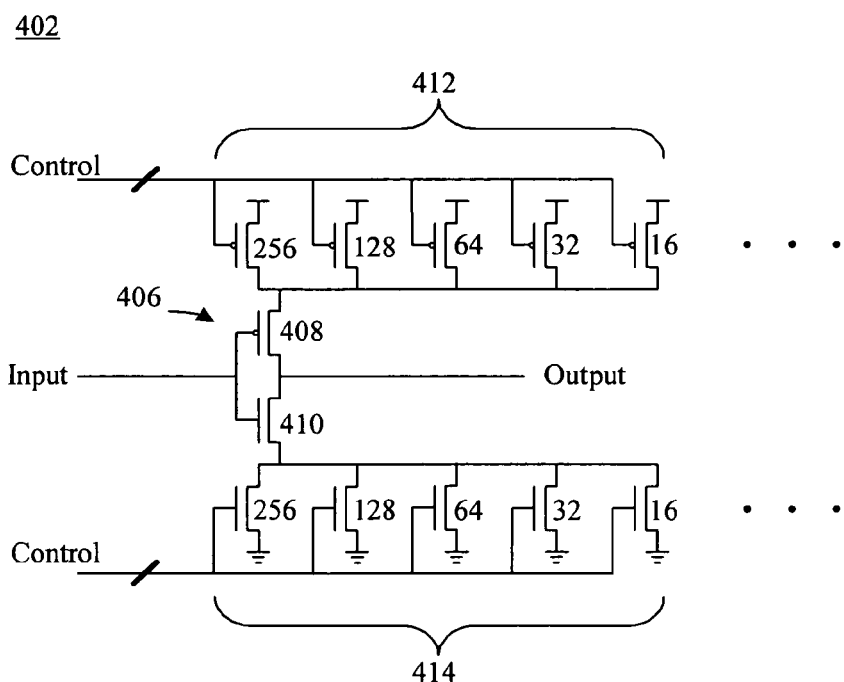
FIG. 4B shows the structure of one of the inverters in FIG. 4A.

Measurements have been conducted on an ADPLL consistent with embodiments of the present invention and fabricated with 0.18 μm technologies. With an oscillation frequency ranging from 150 MHz~450 MHz based on an input reference frequency ranging from 4 MHz~100 MHz, the supply voltage may be as low as 1.8 V, the resolution of the ADPLL is as low as 2 ps, the peak-to-peak jitter of the oscillation signal is about 60 ps at 450 MHz, and the oscillation signal can be locked in in less than 32 cycles of the reference signal. In contrast, a conventional ADPLL such as the one proposed by J. Dunning et al. using DCO 400 shown in FIGS. 4A and 4B has a power supply voltage of 3.3 V and a peak-to-peak jitter of 125 ps, and requires about 50 cycles of the reference signal to lock in the output oscillation signal. Here, jitter is defined as an abrupt change in the phase of the oscillation signal. The ADPLL consistent with embodiments of the present invention occupies a smaller chip area than conventional ADPLL's, and the measurements also show that the ADPLL consistent with embodiments of the present invention consumes less power than conventional ADPLL's with similar other specifications.

It will be apparent to those skilled in the art that various modifications and variations can be made in the disclosed embodiments without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An all-digital phase-locked loop (ADPLL), comprising:
   a digitally controlled oscillator (DCO) for generating an oscillation signal, comprising at least one delay circuit including at least one digitally controlled varactor (DCV), wherein the DCV comprises a transistor having a gate, a source, a drain, and a substrate, wherein at least one of the gate, the source, the drain, and the substrate is coupled to receive one of two or more voltages, wherein at least one of the two or more voltages is not a power supply voltage or ground;
   a frequency divider coupled to receive the oscillation signal and to generate a divided frequency signal, wherein a ratio of a frequency of the oscillation signal to a frequency of the divided frequency signal is a predetermined number;
   a control unit coupled to receive a reference signal having a reference frequency and the divided frequency signal;
   a coarse tuning part including a counter coupled to the control unit for counting cycles of the oscillation signal during one cycle of the reference signal, a comparator for comparing the counted number of cycles of the oscillation signal during one cycle of the reference signal with the predetermined number, a first successive approximation register (SAR) for generating a first control signal based on a result of the comparing of the counted number with the predetermined number, and a first up/down counter coupled to receive the first control signal for generating a first control word for adjusting the frequency of the oscillation signal; and
   a fine tuning part including a phase and frequency detector coupled to the control unit for comparing a phase of the divided frequency signal with a phase of the reference signal, a second SAR for generating a second control signal based on a result of the comparing of the phase of the divided frequency signal with that of the reference signal, and a second up/down counter coupled to receive the second control signal for generating a second control word for adjusting the frequency of the oscillation signal.

2. The ADPLL of claim 1, further comprising a pulse generator for generating a pulse signal upon an edge of a trigger signal, wherein the at least one delay circuit is coupled to delay the pulse signal generated by the pulse generator, and wherein the pulse generator is coupled to receive one of the delayed pulse signal from the at least one delay circuit and an enable signal as the trigger signal.

3. The ADPLL of claim 1, wherein the at least one delay circuit includes a plurality of inverters, wherein the at least one DCV is coupled as a load of the inverters.

4. An all-digital phase-locked loop (ADPLL), comprising:
   a digitally controlled oscillator (DCO), comprising
      a pulse generator for generating a pulse signal upon a trigger signal,
      a first delay circuit coupled to delay the pulse signal by a first delay amount to generate a first delayed signal,
      a second delay circuit coupled to delay the pulse signal by a second delay amount to generate a second delayed signal, and
      an edge combine circuit for generating an oscillation signal from the first delayed signal and the second delayed signal;
   a frequency divider coupled to receive the oscillation signal and to generate a divided frequency signal, wherein a ratio of a frequency of the oscillation signal to a frequency of the divided frequency signal is a predetermined number;
   a control unit coupled to receive a reference signal having a reference frequency and the divided frequency signal;
   a coarse tuning part including a counter coupled to the control unit for counting cycles of the oscillation signal during one cycle of the reference signal, a comparator for comparing the counted number of cycles of the oscillation signal during one cycle of the reference signal with the predetermined number, a first successive approximation register (SAR) for generating a first control signal based on a result of the comparing of the counted number with the predetermined number, and a first up/down counter coupled to receive the first control signal for generating a first control word for adjusting the frequency of the oscillation signal; and
   a fine tuning part including a phase and frequency detector coupled to the control unit for comparing a phase of the divided frequency signal with a phase of the reference signal, a second SAR for generating a second control signal based on a result of the comparing of the phase of the divided frequency signal with that of the reference signal, and a second up/down counter coupled to receive the second control signal for generating a second control word for adjusting the frequency of the oscillation signal.

5. The ADPLL of claim 4, wherein the pulse generator is coupled to receive one of an enable signal and the first delayed signal as the trigger signal.

6. The ADPLL of claim 5, wherein the pulse generator is coupled to receive the enable signal as the trigger signal for generating a first pulse signal upon an initialization of the DCO, and is coupled to receive the first delayed signal as the trigger signal afterwards.

7. The ADPLL of claim 4, wherein the first delay circuit and the second delay circuit are both coupled to receive a control word for controlling the first delay amount and the second delay amount, respectively.

8. The ADPLL of claim 4, wherein the first delay circuit is coupled to receive a first control word for controlling the first delay amount and the second delay circuit is coupled to receive a second control word for controlling the second delay amount.

9. The ADPLL of claim 4, wherein the first delay amount is twice the second delay amount.

10. The ADPLL of claim 4, wherein the edge combine circuit generates an oscillation signal that changes state upon one of a rising edge or a falling edge of either the first delayed signal or the second delayed signal.

11. The ADPLL of claim 4, wherein the first delay circuit and the second delay circuit comprise at least one digitally controlled varactor (DCV), wherein the DCV comprises a transistor having a gate, a source, a drain, and a substrate, wherein at least one of the gate, the source, the drain, and the substrate is coupled to receive one of two or more voltages.

12. The ADPLL of claim 11, wherein at least one of the two or more voltages is not a power supply voltage or ground.

13. The ADPLL of claim 11, wherein the first delay circuit and second delay circuit further comprise serially connected inverters for providing additional delays.

14. The ADPLL of claim 4, wherein at least one of the first delay circuit and second delay circuit comprises
at least a first transistor and a second transistor each having a gate, a source, a drain, and a substrate, wherein a first one of the gate, the source, the drain, and the substrate of the first transistor and a corresponding first one of the gate, the source, the drain, and the substrate of the second transistor are connected together and further coupled to receive one of two or more voltages,
wherein a second one of the gate, the source, the drain, and the substrate of the first transistor is coupled to receive the pulse signal, and
wherein a corresponding second one of the gate, the source, the drain, and the substrate of the second transistor is coupled to receive an invert of the pulse signal.

* * * * *